US010050647B2

(12) United States Patent
Hase

(10) Patent No.: US 10,050,647 B2
(45) Date of Patent: *Aug. 14, 2018

(54) POWER AMPLIFICATION MODULE

(71) Applicant: Murata Manufacturing Co., Ltd., Kyoto (JP)

(72) Inventor: Masatoshi Hase, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/364,690

(22) Filed: Nov. 30, 2016

(65) Prior Publication Data

US 2017/0085232 A1   Mar. 23, 2017

Related U.S. Application Data

(63) Continuation of application No. 15/138,239, filed on Apr. 26, 2016, now Pat. No. 9,647,700.

(30) Foreign Application Priority Data

Apr. 30, 2015 (JP) .................................. 2015-093192

(51) Int. Cl.
*G06G 7/12* (2006.01)
*H04B 1/04* (2006.01)
(Continued)

(52) U.S. Cl.
CPC ............. *H04B 1/04* (2013.01); *H03F 1/0261* (2013.01); *H03F 3/19* (2013.01); *H03F 3/191* (2013.01);
(Continued)

(58) Field of Classification Search
None
See application file for complete search history.

(56) References Cited

U.S. PATENT DOCUMENTS 6,133,594 A * 10/2000 Iwai ..................... H01L 29/7371
257/197
6,414,553 B1 * 7/2002 Luo ......................... H03F 1/302
330/288
(Continued)

FOREIGN PATENT DOCUMENTS

JP   2005-501458 A1   1/2005
JP   2005-228196 A1   8/2005
(Continued)

*Primary Examiner* — Long Nguyen
(74) *Attorney, Agent, or Firm* — Pearne & Gordon LLP

(57) ABSTRACT

A power amplification module includes a first amplification transistor that receives a first signal outputs an amplified second signal from the collector thereof; and a bias circuit that supplies a bias current to the base of the first amplification transistor. The first bias circuit includes a first transistor that is diode connected and is supplied with a bias control current; a second transistor that is diode connected, the collector thereof being connected to the emitter of the first transistor; a third transistor, the base thereof being connected to the base of the first transistor, and the bias current being output from the emitter thereof; a fourth transistor, the collector thereof being connected to the emitter of the third transistor and the base thereof being connected to the base of the second transistor; and a first capacitor between the base and the emitter of the third transistor.

20 Claims, 11 Drawing Sheets

(51) Int. Cl.
  *H03F 3/19* (2006.01)
  *H03F 3/24* (2006.01)
  *H03F 1/02* (2006.01)
  *H03F 3/191* (2006.01)

(52) U.S. Cl.
  CPC ......... *H03F 3/245* (2013.01); *H03F 2200/18* (2013.01); *H03F 2200/222* (2013.01); *H03F 2200/318* (2013.01); *H03F 2200/336* (2013.01); *H03F 2200/387* (2013.01); *H03F 2200/411* (2013.01); *H03F 2200/451* (2013.01); *H03F 2200/555* (2013.01); *H04B 2001/0416* (2013.01)

(56) References Cited

U.S. PATENT DOCUMENTS

| | | | |
|---|---|---|---|
| 7,259,615 B2 * | 8/2007 | Sasho | G05F 3/205 327/540 |
| 7,262,666 B2 * | 8/2007 | Luo | H03F 1/302 330/296 |
| 7,728,672 B2 * | 6/2010 | Choi | H03F 3/189 330/296 |
| 9,647,700 B2 * | 5/2017 | Hase | H03F 3/19 |
| 2005/0179484 A1 | 8/2005 | Sasho et al. | |
| 2009/0160558 A1 * | 6/2009 | Choi | H03F 3/189 330/296 |
| 2016/0322944 A1 * | 11/2016 | Hase | H03F 3/19 |

FOREIGN PATENT DOCUMENTS

| | | |
|---|---|---|
| JP | 2010-283556 A1 | 12/2010 |
| WO | 2003019771 A1 | 3/2003 |

* cited by examiner

PRIOR ART

PRIOR ART

POWER AMPLIFICATION MODULE

This application is a continuation of U.S. patent application Ser. No. 15/138,239 filed on Apr. 26, 2016 which claims priority from Japanese Patent Application No. 2015-093192 filed on Apr. 30, 2015. The contents of these applications are incorporated herein by reference in their entireties.

BACKGROUND

Technical Field

The present disclosure relates to a power amplification module.

A power amplification module is used in a mobile communication device such as a cellular phone in order to amplify the power of a radio frequency (RF) signal to be transmitted to a base station. A bias circuit is used in a power amplification module. The bias circuit is for supplying a bias current to a power amplification transistor. For example, in Japanese Unexamined Patent Application Publication (Translation of PCT Application) No. 2005-501458, there is disclosed a power amplification circuit that uses a bias circuit formed of a cascode current mirror circuit.

FIG. 10 illustrates the configuration of the power amplification circuit disclosed in Japanese Unexamined Patent Application Publication (Translation of PCT Application) No. 2005-501458. In the power amplification circuit illustrated in FIG. 10, the bias circuit is formed of transistors Q2 to Q5 (cascode current mirror circuit). This bias circuit outputs a bias current from the emitter of the transistor Q3 toward the base of a transistor Q1 that forms the amplification circuit.

Here, the bias current output from the bias circuit changes due to the effect of an RF signal (signal input to base of transistor Q1). FIG. 11 illustrates an example of the change in the bias current caused by the effect of the RF signal. As illustrated in FIG. 11, the bias current changes due to the effect of the RF signal. When the level of the RF signal is large, a negative current (current from base of transistor Q1 toward emitter of transistor Q3) is generated in the bias current. At this time, although part of the negative current flows to ground via the transistor Q2, not all of the negative current flows through the transistor Q2. The part of the negative current that does not flow through the transistor Q2 attempts to flow toward the emitter of the transistor Q3 but is cut due to the rectifying characteristics of the PN junction between the base and the emitter of the transistor Q3. When the negative part of the bias current is cut in this way, the average bias current becomes larger and the gain of the power amplification module increases. In other words, the linearity of the gain in the power amplification module is degraded.

This degradation of the linearity of the gain is generated from a smaller RF signal when the size of the current of a current supply Ibias is reduced. Consequently, if an attempt is made to use the power amplification circuit illustrated in FIG. 10 as a variable gain amplification circuit by using the size of the current of the current source Ibias as a mode signal and causing the bias current of the transistor Q1 to change in accordance with the mode signal, the degradation of the linearity of the gain is significant when control is performed to reduce the gain.

A configuration has also been considered in which cutting of the negative part of the bias current is suppressed by increasing the amount of current that flows to the transistor Q2, but this configuration is not preferable since it results in an increase in current consumption. Alternatively, cutting of the negative part of the bias current can also be suppressed by increasing the size of the current of the current source Ibias and increasing the size of the currents of the transistors Q2 and Q3, but there is a problem in that, in addition to the increase in current consumption, control to lower the gain cannot be performed.

BRIEF SUMMARY

The present disclosure suppresses degradation of the linearity of the gain in a power amplification module.

A power amplification module according to an embodiment of the present disclosure includes: a first amplification transistor in which a first signal that is input to a base and a second signal that is obtained by amplifying the first signal are output from a collector; a first resistor; and a first bias circuit that supplies a first bias current to the base of the first amplification transistor via the first resistor. The first bias circuit includes: a first bipolar transistor in which a base and a collector are connected to each other and a bias control current that is supplied to the collector a second bipolar transistor in which a base and a collector are connected to each other and the collector is connected to an emitter of the first bipolar transistor: a third bipolar transistor in which a base is connected to the base of the first bipolar transistor, an emitter is connected to one end of the first resistor, and the first bias current is output from the emitter; a fourth bipolar transistor in which a collector is connected to the emitter of the third bipolar transistor and a base is connected to the base of the second bipolar transistor; and a first capacitor that is provided between the base and the emitter of the third bipolar transistor.

According to the embodiment of the present disclosure, degradation of the linearity of gain in a power amplification module can be suppressed.

Other features, elements, characteristics and advantages of the present disclosure will become more apparent from the following detailed description of embodiments of the present disclosure with reference to the attached drawings.

DETAILED DESCRIPTION

Figure 1:
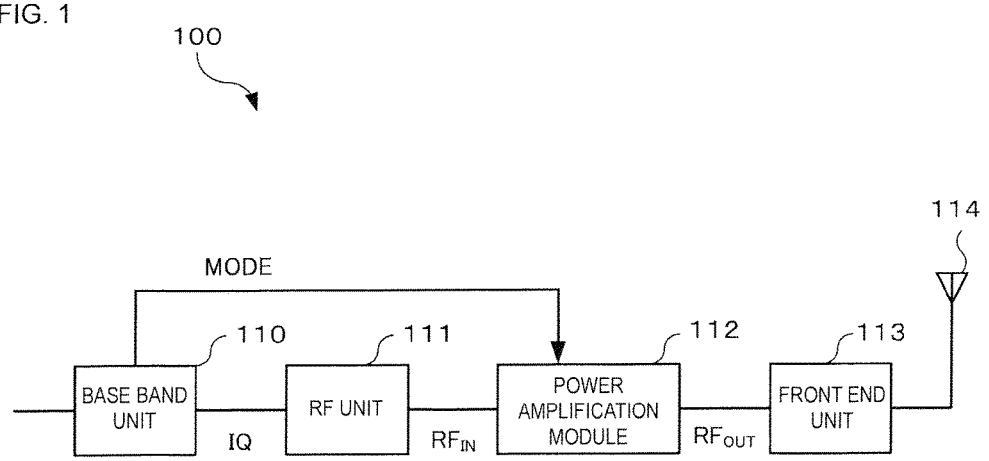
FIG. 1 illustrates an example configuration of a transmission unit that includes a power amplification module according to an embodiment of the present disclosure.

Hereafter, an embodiment of the present disclosure will be described while referring to the drawings. FIG. 1 illustrates an example configuration of a transmission unit that includes a power amplification module according to an embodiment of the present disclosure. A transmission unit 100 is for example used in a mobile communication device such as a cellular phone in order to transmit various signals such as speech and data to a base station. Although such a mobile communication device would also be equipped with a reception unit for receiving signals from the base station, the description of such a reception unit is omitted here.

As illustrated in FIG. 1, the transmission unit 100 includes a base band unit 110, an RF unit 111, a power amplification module 112, a front end unit 113 and an antenna 114.

The base band unit 110 modulates an input signal such as speech or data on the basis of a modulation scheme such as HSUPA or LTE and outputs a modulated signal. In this embodiment, the modulated signal output from the base band unit 110 is output as IQ signals (I signal and Q signal) in which the amplitude and the phase are represented on an IQ plane. The frequencies of the IQ signals are on the order of several MHz to several tens of MHz, for example. In addition, the base band unit 110 outputs a mode signal MODE that is for controlling the gain in the power amplification module 112.

The RF unit 111 generates an RF signal ($RF_{IN}$), which is for performing wireless transmission, from the IQ signals output from the base band unit 110. The RF signal has a frequency of around several hundred MHz to several GHz, for example. In the RF unit 111, the IQ signals may be converted into an intermediate frequency (IF) signal and an RF signal may be then generated from the IF signal, instead of directly converting the IQ signals into the RF signal.

The power amplification module 112 amplifies the power of the RF signal ($RF_{IN}$) output from the RF unit 111 up to the level that is required to transmit the RF signal to the base station, and outputs the amplified signal ($RF_{OUT}$). In the power amplification module 112, the size of a bias current is determined on the basis of the mode signal MODE supplied from the base band unit 110 and the gain is controlled.

The front end unit 113 performs filtering on the amplified signal ($RF_{OUT}$) and switching on a reception signal received from the base station. The amplified signal output from the front end unit 113 is transmitted to the base station via the antenna 114.

Figure 2:
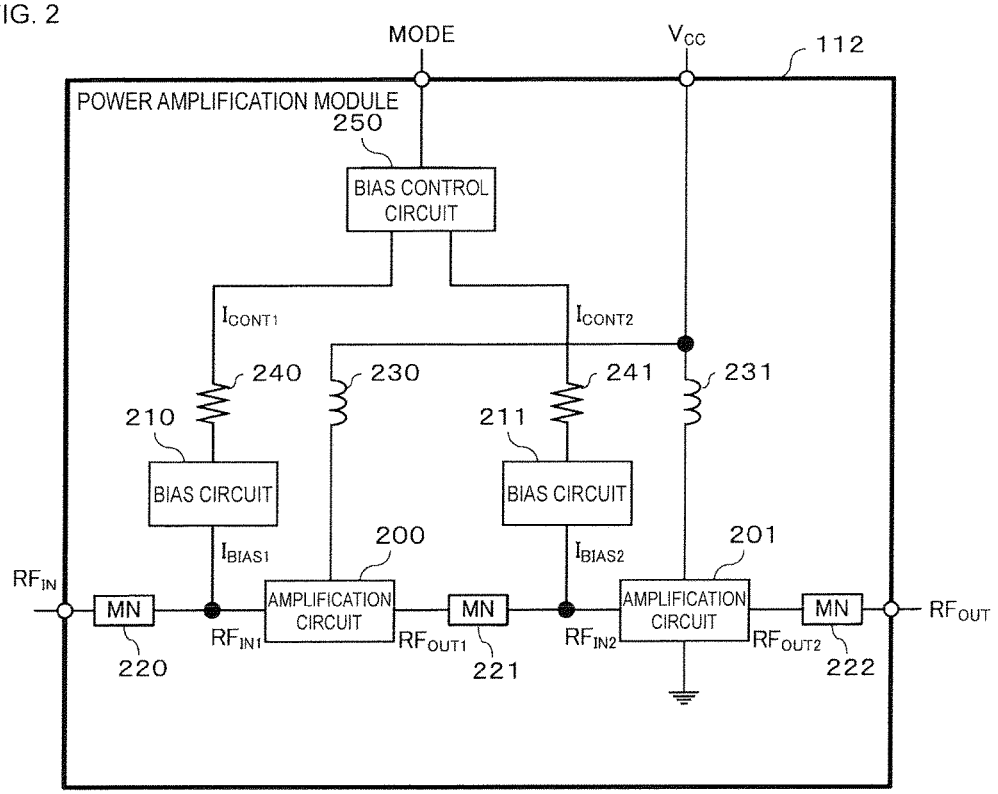
FIG. 2 illustrates an example configuration of the power amplification module.

FIG. 2 illustrates an example configuration of the power amplification module 112. As illustrated in FIG. 2, the power amplification module 112 includes amplification circuits 200 and 201, bias circuits 210 and 211, matching networks (MN) 220, 221 and 222, inductors 230 and 231, resistors 240 and 241 and a bias control circuit 250.

The amplification circuits 200 and 201 form a two-stage amplification circuit. The amplification circuit 200 amplifies an RF signal ($RF_{IN1}$) (first signal) and outputs an amplified signal ($RF_{OUT1}$) (second signal). The amplified signal ($RF_{OUT1}$) output from the amplification circuit 200 is input to the amplification circuit 201 via the matching network 221 as an RF signal ($RF_{IN2}$). The amplification circuit 201 amplifies the RF signal ($RF_{IN2}$) and outputs an amplified signal ($RF_{OUT2}$) (third signal). The number of stages of the amplification circuit is not limited to two and may be one or three or more.

The bias circuits 210 and 211 supply bias currents to the amplification circuits 200 and 201, respectively. The bias circuit 210 (first bias circuit) supplies a bias current $I_{BIAS1}$ (first bias current) that corresponds to a bias control current $I_{CONT1}$ (first bias control current) output from the bias control circuit 250 to the amplification circuit 200. In addition, the bias circuit 211 (second bias circuit) supplies a bias current $I_{BIAS2}$ (second bias current) that corresponds to a bias control current $I_{CONT2}$ (second bias control current) output from the bias control circuit 250 to the amplification circuit 201.

The matching networks 220, 221 and 222 are provided in order to match the impedances between the circuits. The matching networks 220, 221 and 222 are formed using inductors and capacitors, for example.

The inductors 230 and 231 are provided in order to isolate the RF signal. A power supply voltage $V_{CC}$ is supplied to the amplification circuits 200 and 201 via the inductors 230 and 231, respectively.

The bias control circuit 250 outputs the bias control currents $I_{CONT1}$ and $I_{CONT2}$, which are for controlling the bias currents $I_{BIAS1}$ and $I_{BIAS2}$, on the basis of the mode signal MODE. The bias control current $I_{CONT1}$ is supplied to the bias circuit 210 via the resistor 240 (fourth resistor). In addition, the bias control current $I_{CONT2}$ is supplied to the bias circuit 211 via the resistor 241. By providing the power amplification module 112 with the resistors 240 and 241, changes in the impedances of the bias circuits 210 and 211 seen from the bias control circuit 250 can be suppressed. In the power amplification module 112, the gain is controlled by controlling the bias currents $I_{BIAS1}$ and $I_{BIAS2}$. The bias control circuit 250 may be provided outside of the power amplification module 112. In addition, the power amplification module 112 does not need to include the resistors 240 and 241.

Figure 3:
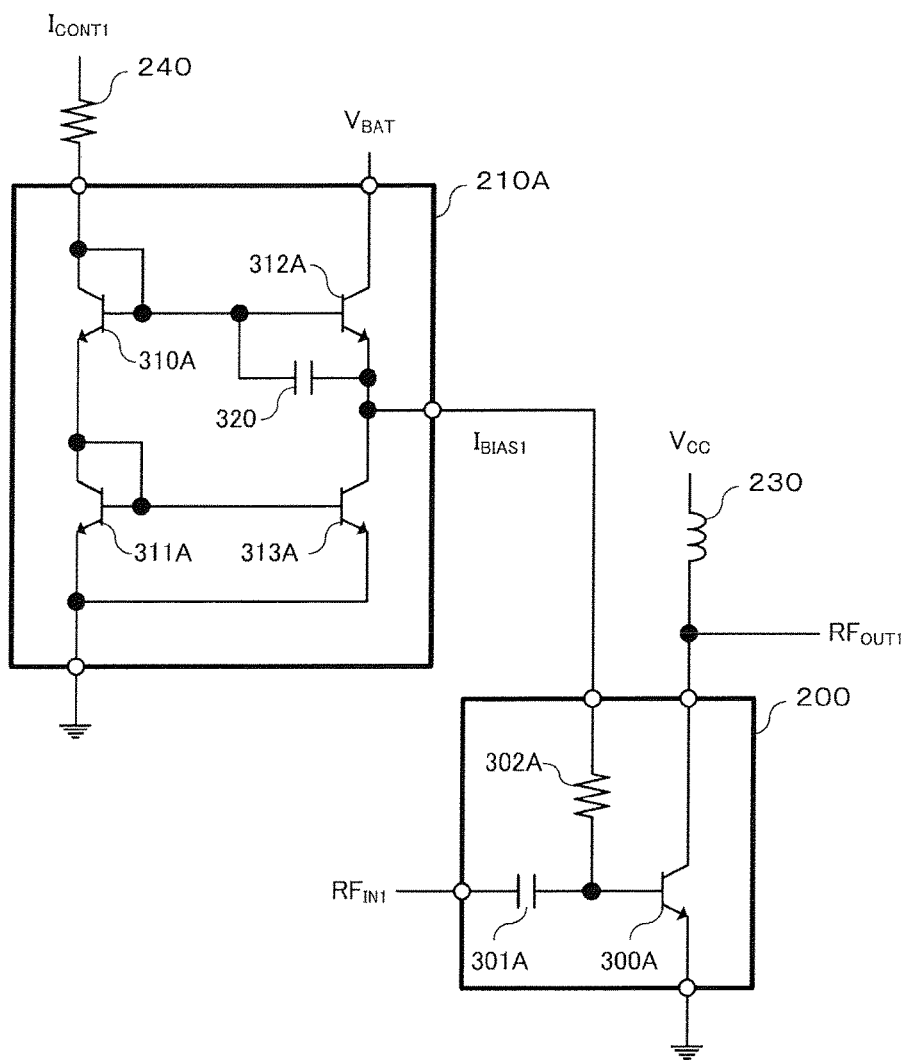
FIG. 3 illustrates example configurations of an amplification circuit and a bias circuit.

FIG. 3 illustrates example configurations of the amplification circuit 200 and the bias circuit 210.

The amplification circuit 200 includes a transistor 300A (first amplification transistor), a capacitor 301A and a resistor 302A (first resistor). The transistor 300A is a heterojunction bipolar transistor (HBT), for example. The RF signal ($RF_{IN1}$) is input to the base of the transistor 300A via the capacitor 301A. The power supply voltage $V_{CC}$ is supplied to the collector of the transistor 300A via the inductor 230. The emitter of the transistor 300A is grounded. In addition, the bias current $I_{BIAS1}$ is supplied to the base of the transistor 300A via the resistor 302A. An amplified signal ($RF_{OUT1}$) is output from the collector of the transistor 300A.

A bias circuit 210A includes transistors 310A, 311A, 312A and 313A and a capacitor 320. The transistors 310A to 313A are HBTs, for example. The transistor 310A (first bipolar transistor) is diode-connected and the bias control current $I_{CONT1}$ is supplied to the collector thereof. The transistor 311A (second bipolar transistor) is diode-connected, the collector thereof is connected to the emitter of the transistor 310A and the emitter thereof is grounded. A power supply voltage (for example, battery voltage $V_{BAT}$) is supplied to the collector of the transistor 312A (third bipolar transistor) and the base of the transistor 312A is connected to the base of the transistor 310A. The collector of the transistor 313A (fourth bipolar transistor) is connected to the emitter of the transistor 312A, the base of the transistor 313A is connected to the base of the transistor 311A, and the emitter of the transistor 313A is grounded. One end of the capacitor 320 (first capacitor) is connected to the base of the transistor 312A and the other end of the capacitor 320 is connected to the emitter of the transistor 312A.

Operation of the bias circuit 210A will be described. In the bias circuit 210A, the bias current $I_{BIAS1}$, which corresponds to the bias control current $I_{CONT1}$, is output from the emitter of the transistor 312A. Here, the bias current $I_{BIAS1}$ undergoes amplitude fluctuations due to the effect of the RF signal ($RF_{IN1}$). When the level of the RF signal ($RF_{IN1}$) increases, the amplitude of the bias current $I_{BIAS1}$ also increases. When the amplitude of the bias current $I_{BIAS1}$ increases and a negative current is generated (current from amplification circuit 200 toward emitter of the transistor 312A), part of this negative current flows from the emitter of the transistor 312A into the base of the transistor 310A via the capacitor 320. In addition, part of this negative current also flows into the transistor 313A.

Thus, current paths (capacitor 320 and transistor 313A) for bypassing the negative current are provided in the bias circuit 210A, and as a result, the bias current $I_{BIAS1}$ is able to become negative along with the change in the RF signal ($RF_{IN1}$). Therefore, since the negative part of the bias current $I_{BIAS1}$ is not cut in the bias circuit 210A, an increase in the average bias current in the case where the level of the RF signal ($RF_{IN1}$) increases can be suppressed. Thus, degradation of the linearity of the gain in the power amplification module 112 can be suppressed.

Figure 4:
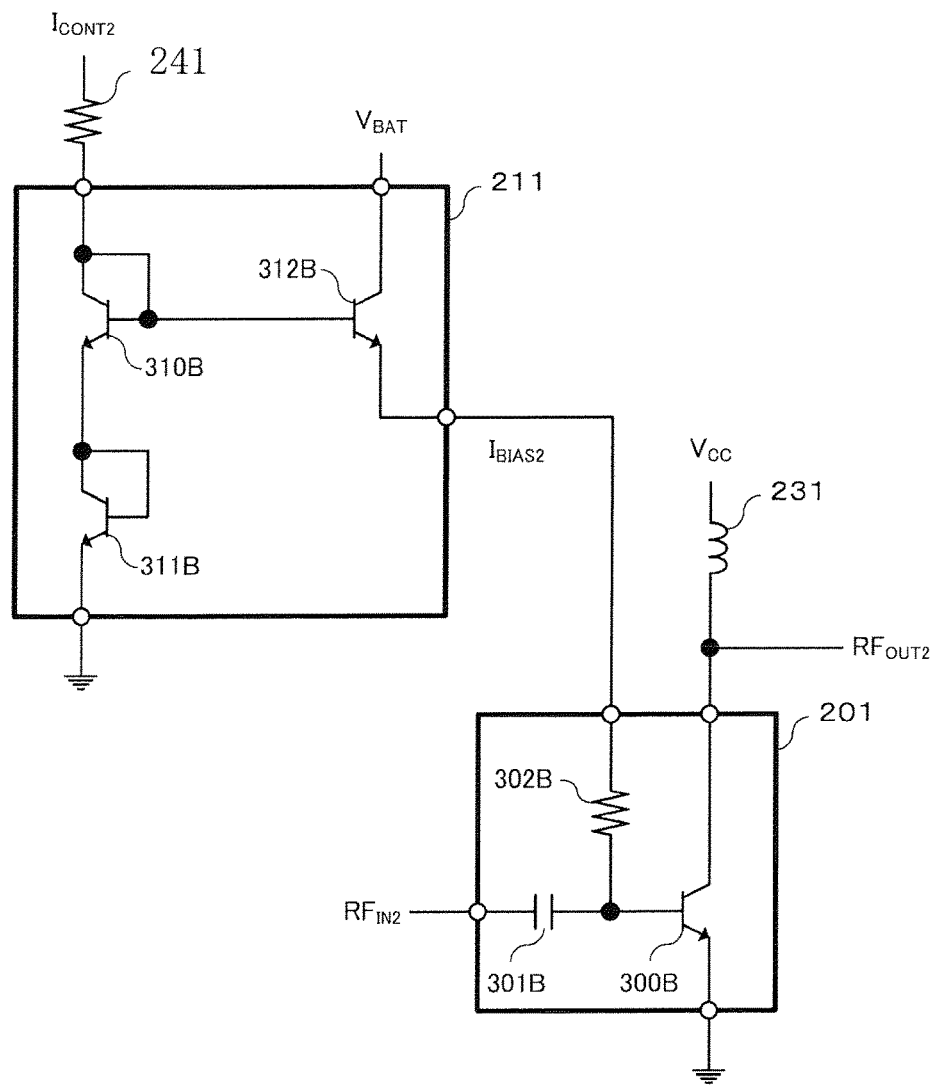
FIG. 4 illustrates example configurations of an amplification circuit and a bias circuit.

FIG. 4 illustrates example configurations of the amplification circuit 201 and the bias circuit 211. Constituent elements that are the same as those of the amplification circuit 200 and the bias circuit 210A illustrated in FIG. 3 are denoted by the same symbols and detailed description thereof is omitted.

The amplification circuit 201 includes a transistor 300B (second amplification transistor), a capacitor 301B and a resistor 302B. The configuration of the inside of the amplification circuit 201 is the same as that of the inside of the amplification circuit 200 and therefore detailed description thereof is omitted.

The bias circuit 211 includes transistors 310B, 311B and 312B. The transistor 310B (fifth bipolar transistor) is diode-connected and the bias control current $I_{CONT2}$ is supplied to the collector thereof. The transistor 311B (sixth bipolar transistor) is diode-connected, the collector thereof is connected to the emitter of the transistor 310B and the emitter thereof is grounded. A power supply voltage (for example, battery voltage $V_{BAT}$) is supplied to the collector of the transistor 312B (seventh bipolar transistor) and the base of the transistor 312B is connected to the base of the transistor 310B.

Operation of the bias circuit 211 will be described. The bias circuit 211 does not include the current paths (capacitor 320 and transistor 313A) that are for bypassing the negative current in the bias circuit 210A. Therefore, in the bias circuit 211, when level of the RF signal ($RF_{IN2}$) increases, the negative part of the bias current $I_{BIAS2}$ may be cut. Consequently, in the bias circuit 211, the average bias current may increase when the level of the RF signal ($RF_{IN2}$) increases. When the average bias current increases, the gain of the amplification circuit 201 increases.

Since an increase in the gain of the amplification circuit 201 is linked to a decrease in the linearity of the power amplification module 112, a configuration the same as the bias circuit 210A could also be considered for the bias circuit 211. However, if current paths for bypassing the negative current are provided as in the bias circuit 210A, it is possible that the maximum power of the amplification circuit 201 will be decreased. Therefore, in the power amplification module 112, a configuration that does not include current paths for bypassing a negative current is adopted for the bias circuit 211, which supplies the bias current $I_{BIAS2}$ to the second-stage amplification circuit 201 that requires a higher power.

However, the bias circuit 211 may have the same configuration as the bias circuit 210A. Furthermore, the bias circuit 211 may have the same configuration as any of bias circuits 210B to 210F described below.

Figure 5:
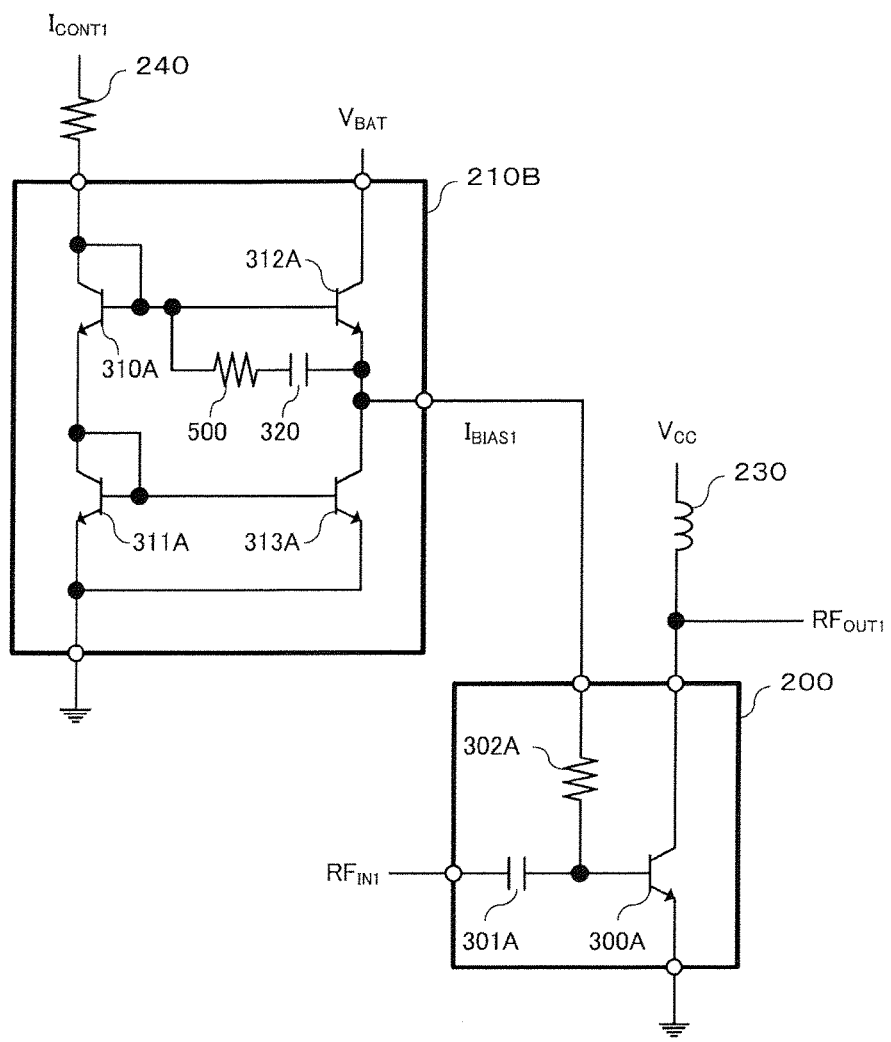
FIG. 5 illustrates another example configuration of the bias circuit.

FIG. 5 illustrates another example configuration of the bias circuit 210. Constituent elements that are the same as those of the bias circuit 210A illustrated in FIG. 3 are denoted by the same symbols and description thereof is omitted.

A bias circuit 210B includes a resistor 500 (second resistor) in addition to the configuration of the bias circuit 210A. One end of the capacitor 320 is connected to the emitter of the transistor 312A and the other end of the capacitor 320 is connected to one end of the resistor 500. The other end of the resistor 500 is connected to the base of the transistor 312A.

In the bias circuit 210B, similarly to as in the bias circuit 210A, when the amplitude of the bias current $I_{BIAS1}$ increases and a negative current is generated, part of this negative current flows from the emitter of the transistor 312A and is bypassed to the transistor 310A via the capacitor 320 and the resistor 500. Thus, an increase in the average bias current can be suppressed and an increase in the gain of the amplification circuit 200 can be suppressed. Then, by adjusting the resistance value of the resistor 500 in the bias circuit 210B, the amount of current bypassed to the transistor 310A can be adjusted.

Figure 6:
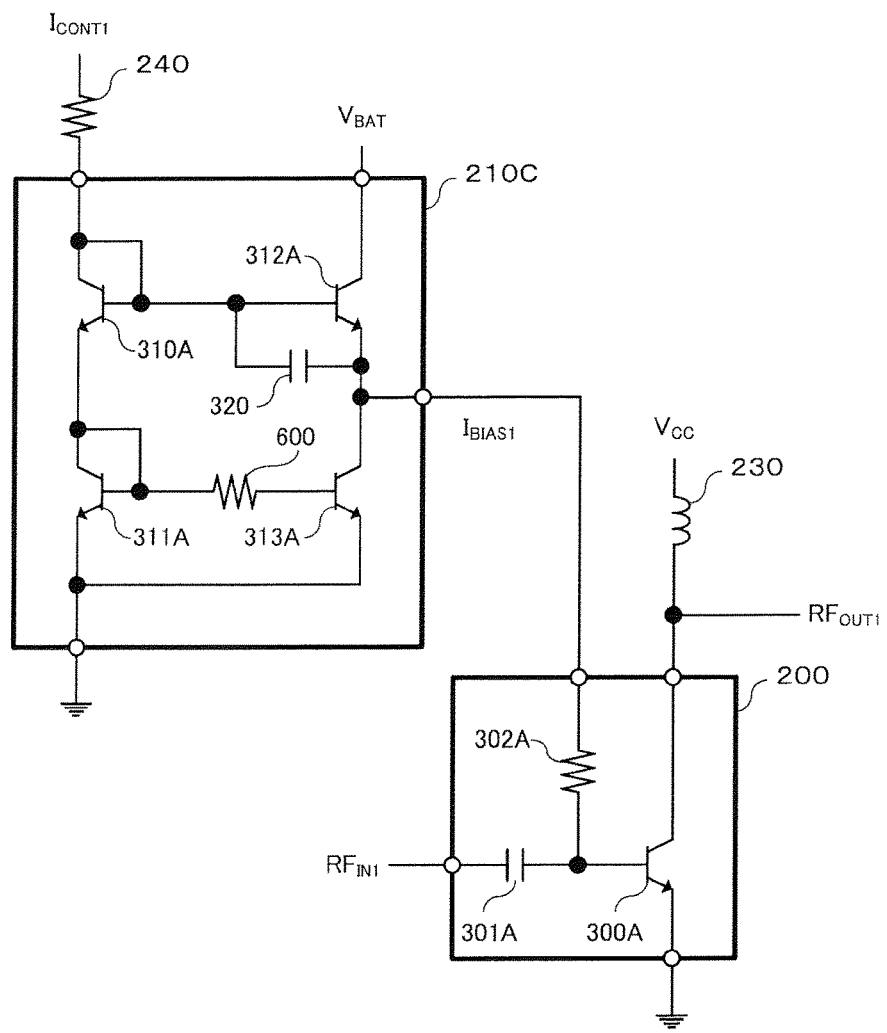
FIG. 6 illustrates another example configuration of the bias circuit.

FIG. 6 illustrates another example configuration of the bias circuit 210. Constituent elements that are the same as those of the bias circuit 210A illustrated in FIG. 3 are denoted by the same symbols and description thereof is omitted.

A bias circuit 210C includes a resistor 600 (third resistor) in addition to the configuration of the bias circuit 210A. One end of the resistor 600 is connected to the base of the transistor 311A and the other end of the resistor 600 is connected to the base of the transistor 313A.

In the bias circuit 210C, similarly to as in the bias circuit 210A, when the amplitude of the bias current $I_{BIAS1}$ increases and a negative current is generated, part of the negative current is bypassed to the transistor 313A. Thus, an increase in the average bias current can be suppressed and an increase in the gain of the amplification circuit 200 can be suppressed. Then, by adjusting the resistance value of the resistor 600 in the bias circuit 210C, the amount of current bypassed to the transistor 313A can be adjusted. The bias circuit 210B illustrated in FIG. 5 may also be provided with the resistor 600. Furthermore, bias circuits 210D to 210F described below may also be provided with the resistor 600.

Figure 7:
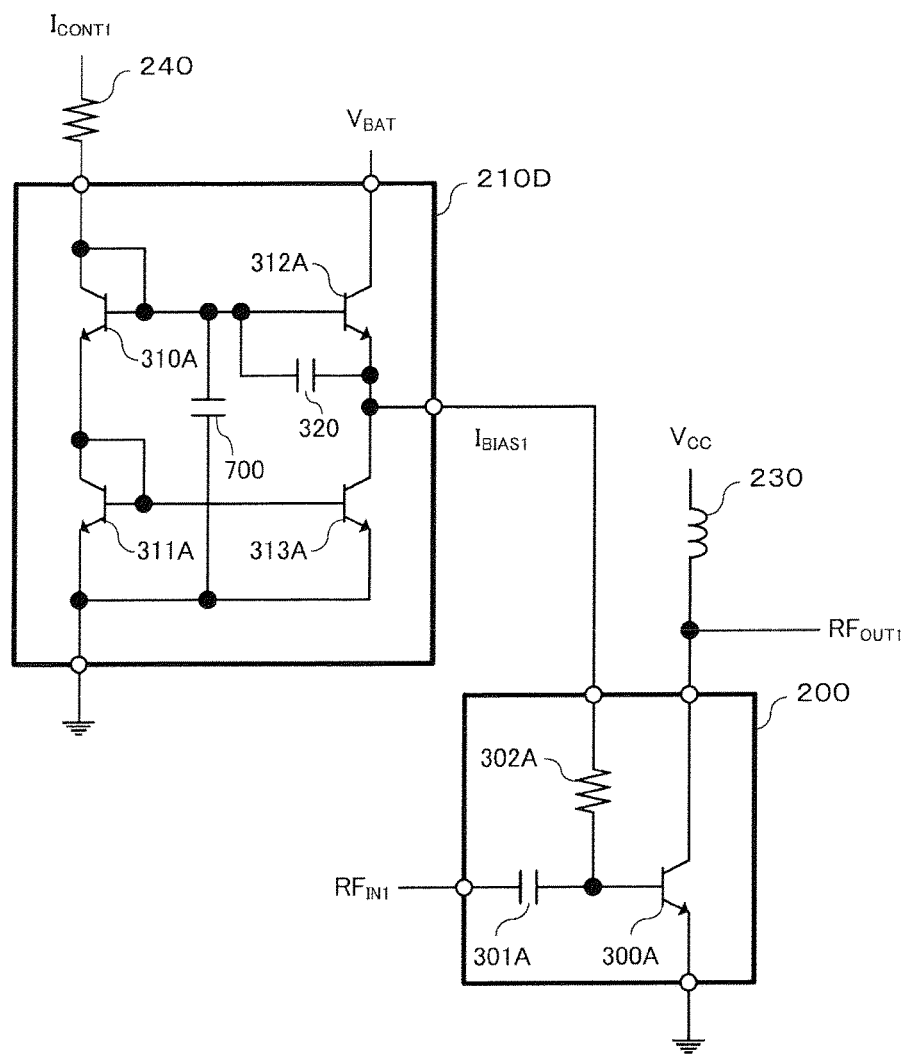
FIG. 7 illustrates another example configuration of the bias circuit.

FIG. 7 illustrates another example configuration of the bias circuit 210. Constituent elements that are the same as those of the bias circuit 210A illustrated in FIG. 3 are denoted by the same symbols and description thereof is omitted.

A bias circuit 210D includes a capacitor 700 (second capacitor) in addition to the configuration of the bias circuit 210A. One end of the capacitor 700 is connected to the base of the transistor 312A and the other end of the capacitor 700 is connected to the emitter of the transistor 313A.

In the bias circuit 210D, similarly to as in the bias circuit 210A, when the amplitude of the bias current $I_{BIAS1}$ increases and a negative current is generated, part of the negative current is bypassed to the transistor 310A. Thus, an increase in the average bias current can be suppressed and an increase in the gain of the amplification circuit 200 can be suppressed. The amount of current bypassed to the transistor 310A can be adjusted by providing the capacitor 700 in the bias circuit 210D.

In addition, in the bias circuit 210D, the effect of variations in the capacitance value of the capacitor 320 can be suppressed by the capacitor 700. For example, if there were no capacitor 700, the size of the bypassed current would vary when the capacitance value of the capacitor 320 varies. In the bias circuit 210D, when the capacitance value of the capacitor 320 increases due to variations, the capacitance value of the capacitor 700 will also similarly increase and therefore fluctuations in the size of the bypassed current are suppressed.

The bias circuits 210B and 210C illustrated in FIGS. 5 and 6 may also be provided with the capacitor 700. In addition, the bias circuits 210E and 210F described below may also be provided with the capacitor 700.

Figure 8:
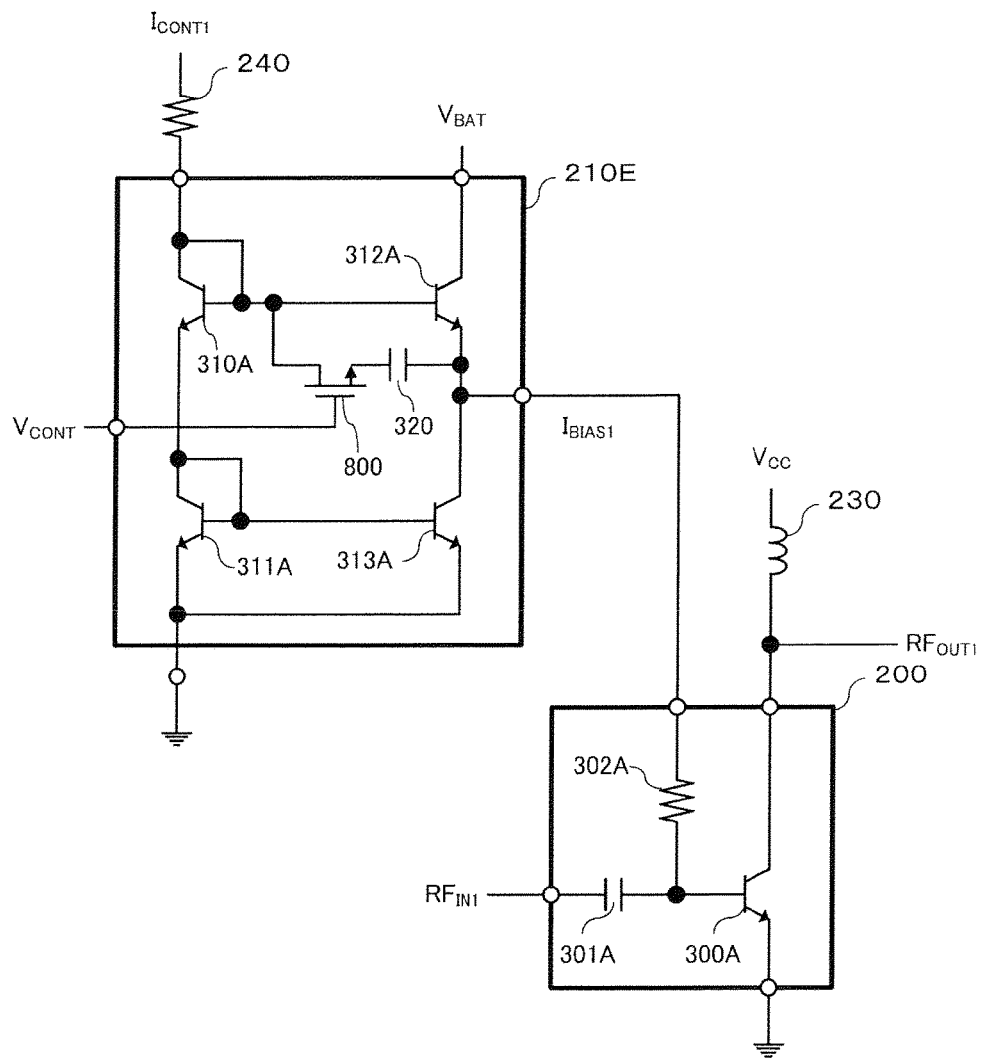
FIG. 8 illustrates another example configuration of the bias circuit.

FIG. 8 illustrates another example configuration of the bias circuit 210. Constituent elements that are the same as those of the bias circuit 210A illustrated in FIG. 3 are denoted by the same symbols and description thereof is omitted.

A bias circuit 210E includes a field effect transistor (FET) 800 (first FET) in addition to the configuration of the bias circuit 210A. One end of the capacitor 320 is connected to the emitter of the transistor 312A and the other end of the capacitor 320 is connected to the source of the FET 800. The drain of the FET 800 is connected to the base of the transistor 312A and a control voltage $V_{CONT}$ (connection control signal) is supplied to the gate of the FET 800.

In the bias circuit 210E, the electrical connection of the capacitor 320 between the base and the emitter of the transistor 312A is controlled by the control voltage $V_{CONT}$ output from the bias control circuit 250.

Specifically, for example, in the case where the power of the RF signal ($RF_{IN1}$) is comparatively low, the FET 800 is turned on, and, consequently, part of the negative current of the bias current $I_{BIAS1}$ is bypassed to the transistor 310A and an increase in the gain of the amplification circuit 200 can be suppressed, similarly to as in the bias circuit 210A.

Furthermore, for example, in the case where the power of the RF signal ($RF_{IN1}$) is comparatively high, the FET 800 is turned off, and consequently the bypass to the transistor 310A is halted and a reduction in the maximum power of the amplification circuit 200 can be suppressed. The size of the current for the FET 800 may be controlled in a step-wise manner in accordance with the level of the control voltage $V_{CONT}$ rather than with an on/off binary operation.

The bias circuits 210B to 210D illustrated in FIGS. 5 to 7 may also be provided with the FET 800. In addition, a bias circuit 210F described below may also be provided with the FET 800.

Figure 9:
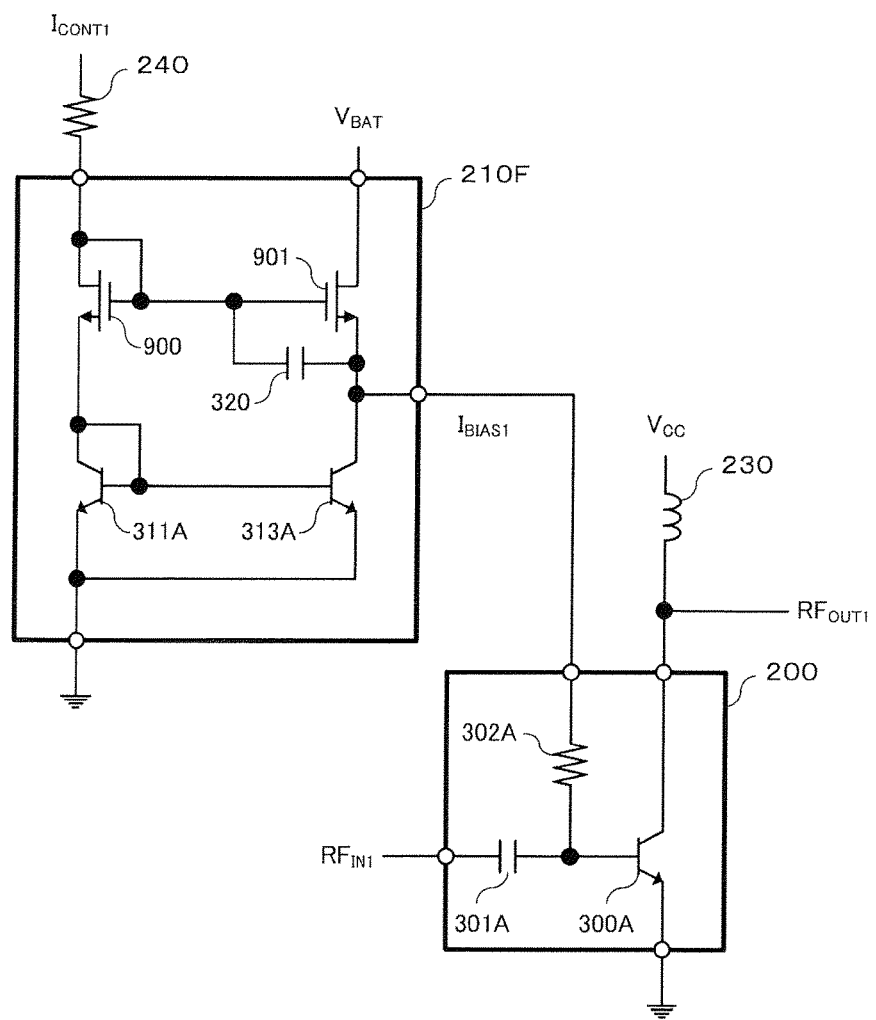
FIG. 9 illustrates another example configuration of the bias circuit.
Figure 10:
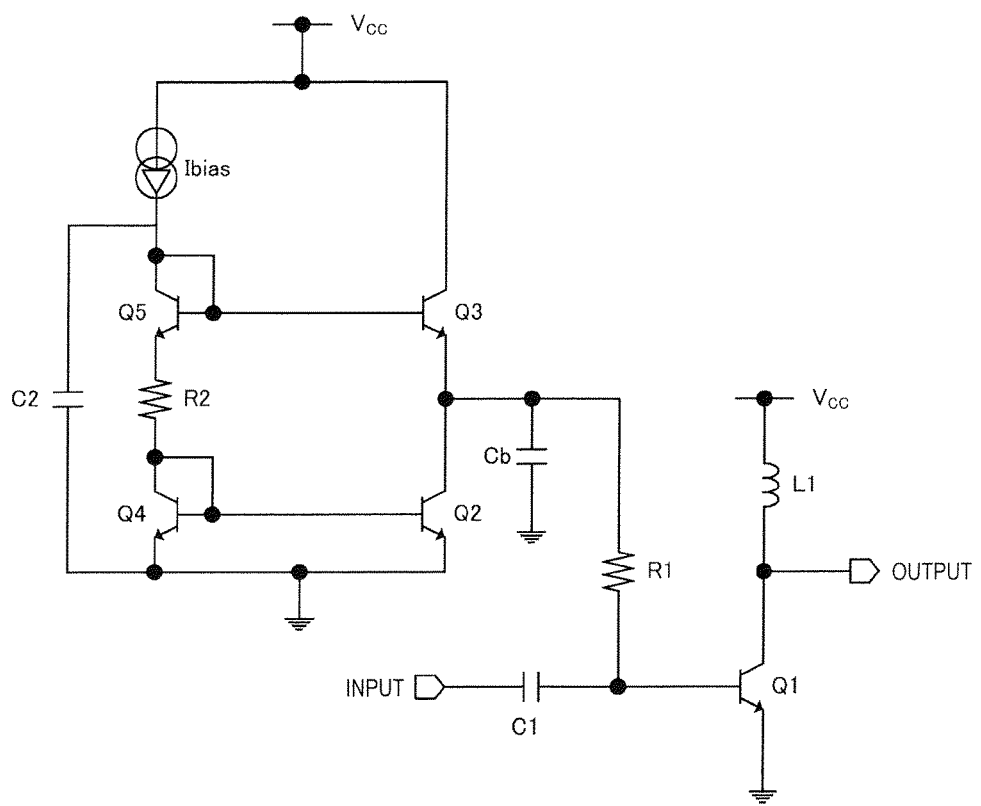
FIG. 10 illustrates an example of a power amplification circuit that employs a bias circuit formed of a cascode current mirror circuit.
Figure 11:
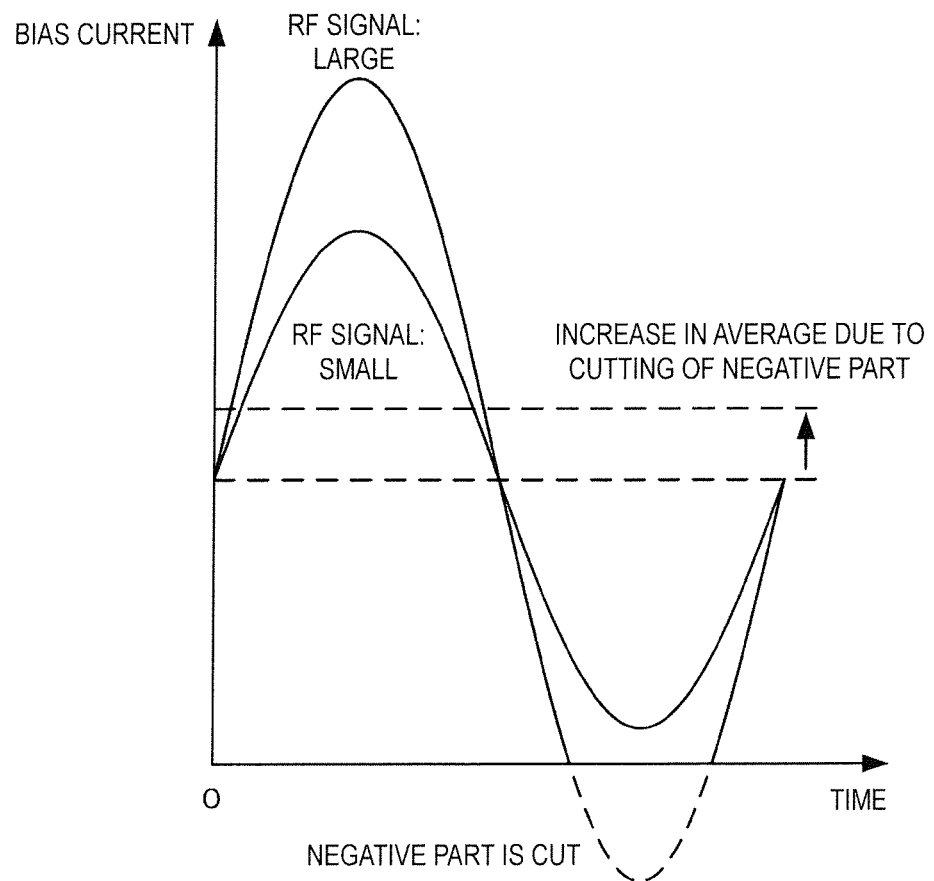
FIG. 11 illustrates an example of a change in a bias current caused by the effect of an RF signal.

FIG. 9 illustrates another example configuration of the bias circuit 210. Constituent elements that are the same as those of the bias circuit 210A illustrated in FIG. 3 are denoted by the same symbols and description thereof is omitted.

A bias circuit 210F includes FETs 900 and 901 instead of the transistors 310A and 312A of the bias circuit 210A. The FET 900 (second FET) is diode-connected and the bias control current $I_{CONT1}$ is supplied to the drain thereof. The collector of the transistor 311A is connected to the source of the FET 900. A power supply voltage (for example, battery voltage $V_{BAT}$) is supplied to the drain of the FET 901 (third FET) and the gate of the FET 901 is connected to the gate of the FET 900. The collector of the transistor 313A is connected to the source of the FET 901. One end of the capacitor 320 is connected to the gate of the FET 901 and the other end of the capacitor 320 is connected to the source of the FET 901.

In the bias circuit 210F, the FETs 900 and 901 operate similarly to the transistors 310A and 312A of the bias circuit 210A. In other words, the bias current $I_{BIAS1}$ is output from the source of the FET 901. In the bias circuit 210F, similarly to as in the bias circuit 210A, when the amplitude of the bias current $I_{BIAS1}$ increases and a negative current is generated, part of the negative current is bypassed to the FET 900 via the capacitor 320. Thus, an increase in the average bias current can be suppressed and an increase in the gain of the amplification circuit 200 can be suppressed. In the bias circuit 210F, since the FETs 900 and 901 are used, lower voltage operation is possible compared with the case where the transistors 310A and 312A are used. The bias circuits 210B to 210E illustrated in FIGS. 5 to 8 may also be provided with the FETs 900 and 901 instead of the transistors 310A and 312A.

Exemplary embodiments of the present disclosure have been described above. In the power amplification module 112, by providing a current path for bypassing a negative current of the bias current $I_{BIAS1}$ in the bias circuit 210, the bias current $I_{BIAS1}$ is able to become negative along with a change in the RF signal ($RF_{IN1}$). Therefore, since the negative part of the bias current $I_{BIAS1}$ is not cut in the bias circuit 210, an increase in the average bias current in the case where the level of the RF signal ($RF_{IN1}$) increases can be suppressed. Thus, degradation of the linearity of the gain in the power amplification module 112 can be suppressed.

Furthermore, in the power amplification module 112, by providing the resistor 500 that is connected in series with the capacitor 320 as in the bias circuit 210B illustrated in FIG. 5, the amount of current bypassed to the transistor 310A can be adjusted.

In addition, in the power amplification module 112, by providing the resistor 600 between the bases of the transistors 311 and 313 as in the bias circuit 210C illustrated in FIG. 6, the amount of current bypassed to the transistor 313A can be adjusted.

Furthermore, in the power amplification module 112, by providing the capacitor 700 between the base of the transistor 312A and the emitter of the transistor 313A as in the bias circuit 210D illustrated in FIG. 7, the amount of current bypassed to the transistor 310A can be adjusted. In addition, the effect of variations in the capacitance value of the capacitor 320 can be canceled out by the capacitor 700.

In addition, the power amplification module 112 can be provided with the FET 800 that controls the electrical connection of the capacitor 320 between the base and the emitter of the transistor 312A, as in the bias circuit 210E illustrated in FIG. 8. As a result, for example, in the case where the power of the RF signal ($RF_{IN1}$) is comparatively high, the FET 800 is turned off, and consequently the bypass to the transistor 310A is halted and a reduction in the maximum power of the amplification circuit 200 can be suppressed.

In addition, by providing the power amplification module 112 with the FETs 900 and 901 instead of the transistors 310A and 312A as in the bias circuit 210F illustrated in FIG. 9, low voltage operation can be realized.

Furthermore, by providing the power amplification module 112 with the resistors 240 and 241, as illustrated in FIG. 2, changes in the impedances of the bias circuits 210 and 211 seen from the bias control circuit 250 can be suppressed.

In addition, in the power amplification module 112, for the bias circuit 211 that supplies the bias current $I_{BIAS2}$ to the subsequent amplification circuit 201, a configuration can be adopted that does not include a current path for bypassing the negative current of the bias current $I_{BIAS2}$, as illustrated in FIG. 4. In this way, a reduction in the maximum power in the subsequent power amplification circuit 201, which requires a higher power, can be suppressed. In a power amplification module equipped with a power amplification circuit of three or more stages as well, the bias circuit that supplies a bias current to the final stage amplification circuit can have a configuration that does not include a current path for bypassing a negative current.

The embodiments described above are for enabling easy understanding of the present disclosure and the embodiments are not to be interpreted as limiting the present disclosure. The present disclosure can be modified or improved without departing from the gist of the disclosure and equivalents to the present disclosure are also included in the present disclosure. In other words, appropriate design modifications made to the embodiments by one skilled in the art are included in the scope of the present disclosure so long as the modifications have the characteristics of the present disclosure. For example, the elements included in the embodiments and the arrangements, materials, conditions, shapes, sizes and so forth of the elements are not limited to those exemplified in the embodiments and can be appropriately changed. In addition, the elements included in the embodiments can be combined as much as technically possible and such combined elements are also included in the scope of the present disclosure so long as the combined elements have the characteristics of the present disclosure.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplification module comprising:
   a first amplification transistor in which a first signal is input to a base of the first amplification transistor and a second signal obtained by amplifying the first signal is output from a collector of the first amplification transistor;
   a first resistor; and
   a first bias circuit that supplies a first bias current to the base of the first amplification transistor via the first resistor;
   wherein the first bias circuit comprises:
   a first transistor, in which a base or gate of the first transistor is connected to a collector or drain of the first transistor, and a bias control current is supplied to the collector or drain of the first transistor,
   a second transistor in which a base and a collector of the second transistor are connected to each other and the collector of the second transistor is connected to an emitter or source of the first transistor,
   a third transistor in which a base or gate of the third transistor is connected to the base or gate of the first transistor, an emitter or source of the third transistor is connected to a first end of the first resistor and the first bias current is output from the emitter or source of the third transistor,
   a fourth transistor in which a collector of the fourth transistor is connected to the emitter of the third transistor and a base of the fourth transistor is connected to the base of the second transistor, and
   a first capacitor that is provided between the base or gate of the third transistor and the emitter or source of the third transistor, wherein the first capacitor is directly connected to the emitter or source of the third transistor.

2. The power amplification module according to claim 1, wherein an emitter of the fourth transistor is connected to an emitter of the second transistor.

3. The power amplification module according to claim 1, wherein the first, second, third, and fourth transistors are heterojunction bipolar transistors.

4. The power amplification module according to claim 1, wherein the first bias circuit further includes a second resistor that is connected in series with the first capacitor between the base and emitter of the third transistor.

5. The power amplification module according to claim 1, wherein the first bias circuit further includes a third resistor that is provided between the base of the second transistor and the base of the fourth transistor.

6. The power amplification module according to claim 1, wherein the first bias circuit further includes a second capacitor, in which a first end of the second capacitor is connected to the base of the third transistor and a second end of the second capacitor is connected to the emitter of the fourth transistor.

7. The power amplification module according to claim 1, wherein the first bias circuit further includes a first field-effect transistor (FET) that controls an electrical connection of the first capacitor between the base and the emitter of the third transistor on the basis of a connection control signal.

8. The power amplification module according to claim 1, further comprising:
   a fourth resistor in which the bias control current is supplied to one end of the fourth resistor and another end of the fourth resistor being connected to the collector of the first transistor.

9. The power amplification module according to claim 1, wherein the first and third transistors are field-effect transistors (FET),
   the gate of the first transistor and the drain of the first transistor are connected to each other and the bias control current is supplied to the drain of the first transistor, and
   the gate of the third transistor is connected to the gate of the first transistor and the source of the third transistor is connected to the first end of the first resistor.

10. The power amplification module according to claim 1, further comprising:
    a second amplification transistor in which the second signal is input to a base of the second amplification transistor and a third signal obtained by amplifying the second signal is output from a collector of the second amplification transistor,
    a fifth resistor, and
    a second bias circuit that supplies a second bias current to the base of the second amplification transistor via the fifth resistor,
    the second bias circuit including:
    a fifth transistor in which a base and a collector of the fifth transistor are connected to each other and the bias control current is supplied to the collector of the fifth transistor,
    a sixth transistor in which a base and a collector of the sixth transistor are connected to each other and the collector is connected to an emitter of the fifth bipolar transistor, and a seventh transistor in which a base of the seventh transistor is connected to the base of the fifth transistor, an emitter of the seventh transistor is connected to a first end of the fifth resistor and the second bias current is output from an emitter and the seventh transistor, the second bias circuit not including a capacitor between the base and the emitter of the seventh bipolar transistor.

11. The power amplification module according to claim 10, wherein the fifth, sixth, and seventh transistors are heterojunction bipolar transistors.

12. The power amplification module according to claim 1, wherein the first bias current is negative along with a change in the first signal.

13. The power amplification module according to claim 1, wherein an average value of the first bias current does not increase when a level of the first signal increases.

14. The power amplification module according to claim 2, wherein the first bias circuit further includes a third resistor that is provided between the base of the second transistor and the base of the fourth transistor.

15. The power amplification module according to claim 2, wherein the first bias circuit further includes a second capacitor, in which a first end of the second capacitor is connected to the base of the third transistor and a second end of the second capacitor is connected to the emitter of the fourth transistor.

16. The power amplification module according to claim 3, wherein the first bias circuit further includes a second capacitor, in which a first end of the second capacitor is connected to the base of the third transistor and a second end of the second capacitor is connected to the emitter of the fourth transistor.

17. The power amplification module according to claim 2, further comprising:
a fourth resistor in which the bias control current is supplied to one end of the fourth resistor and another end of the fourth resistor being connected to the collector of the first transistor.

18. The power amplification module according to claim 3, further comprising:
a fourth resistor in which the bias control current is supplied to one end of the fourth resistor and another end of the fourth resistor being connected to the collector of the first transistor.

19. A power amplification module comprising:
a first amplification transistor in which a first signal is input to a base of the first amplification transistor and a second signal obtained by amplifying the first signal is output from a collector of the first amplification transistor;
a first resistor; and
a first bias circuit that supplies a first bias current to the base of the first amplification transistor via the first resistor;
wherein the first bias circuit comprises:
a first transistor, in which a base or gate of the first transistor is connected to a collector or drain of the first transistor, and a bias control current is supplied to the collector or drain of the first transistor,
a second transistor in which a base and a collector of the second transistor are connected to each other and the collector of the second transistor is connected to an emitter or source of the first transistor,
a third transistor in which a base or gate of the third transistor is connected to the base or gate of the first transistor, an emitter or source of the third transistor is connected to a first end of the first resistor and the first bias current is output from the emitter or source of the third transistor, and
a first capacitor that is provided between the base or gate of the third transistor and the emitter or source of the third transistor, wherein the first capacitor is directly connected to the emitter or source of the third transistor.

20. The power amplification module according to claim 19, wherein the first bias circuit further includes a second resistor that is connected in series with the first capacitor between the base and emitter of the third transistor.

* * * * *